United States Patent
Hayakawa et al.

(10) Patent No.: US 10,662,521 B2
(45) Date of Patent: May 26, 2020

(54) SUBSTRATE WITH TRANSPARENT ELECTRODE AND METHOD FOR MANUFACTURING SAME

(71) Applicant: KANEKA CORPORATION, Osaka-shi, Osaka (JP)

(72) Inventors: Hironori Hayakawa, Otsu (JP); Takashi Kuchiyama, Settsu (JP); Kenji Yamamoto, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 210 days.

(21) Appl. No.: 15/880,470

(22) Filed: Jan. 25, 2018

(65) Prior Publication Data

US 2018/0187300 A1    Jul. 5, 2018

Related U.S. Application Data

(63) Continuation of application No. 14/653,805, filed as application No. PCT/JP2013/083905 on Dec. 18, 2013, now Pat. No. 9,903,015.

(30) Foreign Application Priority Data

Dec. 19, 2012  (JP) ................. 2012-277453

(51) Int. Cl.
  *B32B 15/04* (2006.01)
  *B32B 17/06* (2006.01)
  (Continued)

(52) U.S. Cl.
  CPC ............ *C23C 14/34* (2013.01); *C23C 14/086* (2013.01); *C23C 14/3414* (2013.01);
  (Continued)

(58) Field of Classification Search
  USPC ................. 428/426, 688, 701, 702
  See application file for complete search history.

(56) References Cited

U.S. PATENT DOCUMENTS

| 6,617,056 B1 * | 9/2003 | Hara | C23C 14/0036 |
|---|---|---|---|
| | | | 204/192.14 |
| 2001/0008207 A1 * | 7/2001 | Ando | C23C 14/0057 |
| | | | 204/192.28 |

(Continued)

FOREIGN PATENT DOCUMENTS

| JP | H07028098 A | 1/1995 |
|---|---|---|
| JP | 2010080290 A | 4/2010 |

(Continued)

OTHER PUBLICATIONS

WO2010140275 Hideo Englsih machine translation.*

(Continued)

*Primary Examiner* — Lauren R Colgan
(74) *Attorney, Agent, or Firm* — Alleman Hall Creasman & Tuttle LLP

(57) ABSTRACT

A substrate with a transparent electrode which includes an amorphous transparent electrode layer on a transparent film substrate. When a bias voltage of 0.1 V is applied to the amorphous transparent electrode layer, the layer has continuous regions where a current value at a voltage-applied surface is 50 nA or more. Each of the continuous regions has an area of 100 nm² or more and the number of the continuous regions is 50/μm² or more. In one embodiment, the layer has a tin oxide content of 6.5% or more and 8% or less by mass. With respect to the substrate with a transparent electrode according to the present invention, the transparent electrode layer may be crystallized in a short period of time.

5 Claims, 4 Drawing Sheets

(51) Int. Cl.
*C23C 14/34* (2006.01)
*H05K 1/09* (2006.01)
*C23C 14/08* (2006.01)
*G06F 3/044* (2006.01)
*H05K 3/16* (2006.01)

(52) U.S. Cl.
CPC ............ *G06F 3/044* (2013.01); *H05K 1/09*
(2013.01); *H05K 3/16* (2013.01); *B32B*
*2307/412* (2013.01); *B32B 2307/702*
(2013.01); *B32B 2457/208* (2013.01); *G06F*
*2203/04103* (2013.01); *H05K 2201/0326*
(2013.01); *H05K 2201/10053* (2013.01); *H05K*
*2203/1194* (2013.01)

(56) References Cited

U.S. PATENT DOCUMENTS

| | | | | |
|---|---|---|---|---|
| 2002/0034836 | A1* | 3/2002 | Kiyota | C23C 14/086 438/48 |
| 2009/0104440 | A1* | 4/2009 | Nashiki | C08J 7/045 428/336 |
| 2009/0267029 | A1* | 10/2009 | Takahashi | C04B 35/453 252/512 |
| 2010/0164896 | A1 | 7/2010 | Nakayama et al. | |
| 2011/0011731 | A1* | 1/2011 | Takahashi | C23C 14/086 204/192.1 |
| 2011/0177314 | A1* | 7/2011 | Tatami | C23C 14/086 428/220 |
| 2012/0111718 | A1 | 5/2012 | Haishi et al. | |
| 2012/0114923 | A1 | 5/2012 | Haishi et al. | |
| 2012/0263947 | A1* | 10/2012 | Ozawa | C09J 133/08 428/354 |
| 2013/0288047 | A1* | 10/2013 | Kajihara | C23C 14/3414 428/336 |
| 2014/0020810 | A1 | 1/2014 | Nakayama et al. | |
| 2014/0035193 | A1 | 2/2014 | Haishi et al. | |
| 2014/0036171 | A1 | 2/2014 | Haishi et al. | |

FOREIGN PATENT DOCUMENTS

| | | |
|---|---|---|
| JP | 2010170530 A | 8/2010 |
| JP | 2011018623 A | 1/2011 |
| JP | 2012114070 A | 6/2012 |
| JP | 2012134085 A | 7/2012 |
| WO | 2010140275 A1 | 12/2010 |
| WO | 2011048648 A1 | 4/2011 |
| WO | 2012105644 A1 | 8/2012 |
| WO | 2013081106 A1 | 6/2013 |
| WO | 2013118693 A1 | 8/2013 |

OTHER PUBLICATIONS

International Bureau of WIPO, International Preliminary Report on Patentability Issued in Application No. PCT/JP2013/083905, dated Dec. 18, 2013, WIPO, 9 pages.
ISA Japan Patent Office, International Search Report Issued in PCT Application No. PCT/JP2013/083905, dated Feb. 4, 2014, WIPO, 4 pages. (Submitted with English Translation of International Search Report).

* cited by examiner

SUBSTRATE WITH TRANSPARENT ELECTRODE AND METHOD FOR MANUFACTURING SAME

CROSS REFERENCE TO RELAYED APPLICATIONS

This application is a continuation of U.S. patent application Ser. No. 14/653,805 (now U.S. Pat. No. 9,903,015), entitled SUBSTRATE WITH TRANSPARENT ELECTRODE AND METHOD FOR MANUFACTURING SAME, filed Jun. 18, 2015, which is the U.S. National Phase of International Patent Application No. PCT/JP2013/083905, entitled SUBSTRATE WITH TRANSPARENT ELECTRODE AND METHOD FOR PRODUCING SAME, filed Dec. 18, 2013, which in turn claims priority to Japanese Patent Application No. 2012-277453, filed Dec. 19, 2012. Each of these applications is hereby incorporated by reference in its entirety for all purposes.

TECHNICAL FIELD

The present invention relates to a substrate with a transparent electrode in which a transparent electrode layer is provided on a transparent film substrate. Particularly, the present invention relates to a substrate with a transparent electrode layer for a capacitive touch panel, and a method for manufacturing the substrate with a transparent electrode layer.

BACKGROUND ART

A substrate with a transparent electrode, in which a transparent electrode layer composed of a conductive oxide thin film is formed on a transparent substrate such as a transparent film or glass, is widely used as a transparent electrode of a display, a touch panel, or the like. Principal factors that determine performance of a substrate with a transparent electrode include an electric resistance and a light transmittance of a transparent electrode layer, and an indium-tin composite oxide (ITO) is widely used as a material having both a low resistance and a high transmittance.

In recent years, a substrate with a transparent electrode, which includes a transparent electroconductive layer having a lower resistance than those in the past, has been needed as the size of screens of displays and touch panels have increased. Patent Document 1 describes that when the tin oxide content of ITO on a glass substrate is increased, the carrier density increases, so that an ITO transparent electrode layer has a reduced resistance. More specifically, in Patent Document 1, film formation is performed at a substrate temperature in a range of 230 to 250° C. using a target with a tin oxide content of about 10% by mass.

On the other hand, when a film is used as a transparent substrate, the substrate temperature cannot be raised during film formation in view of the heat resistance of the substrate. Therefore, when a film substrate is used, a method is widely used in which an amorphous ITO film is formed on a film substrate by a sputtering method at a low temperature (e.g. 150° C. or lower), and then heated/annealed under an oxygen atmosphere to transform the amorphous ITO film into a crystalline ITO film. However, there is the problem that as the tin oxide content of the ITO film becomes greater, an amount of time required for crystallization increases, and therefore productivity of a substrate with a transparent electrode is reduced, or crystallization is insufficient, so that a reduction of the resistance is hindered as described in Patent Document 2.

When an ITO film is formed on a glass substrate as a measure against the above-mentioned problem, the time required for crystallization can be reduced by annealing the ITO film at a high temperature of 200° C. or higher. However, since a film substrate cannot withstand such a high temperature, an ITO film formed on a transparent film substrate should be crystallized at a relatively low temperature of about 150° C., and thus it is not easy to improve productivity by reducing the time required for crystallization.

Patent Document 3 describes a method in which ITO having a high tin oxide content and ITO having a low tin oxide content are laminated to reduce the time required for crystallization. In the method in Patent Document 3, however, a sufficient reduction of the resistance of the ITO film after crystallization is hindered because ITO having a low tin oxide content is partially used. For laminating a plurality of ITO films having different tin oxide contents, a plurality of targets having different tin oxide contents should be used, which may cause a reduction in productivity and an increase in cost of production equipment.

Patent Document 4 describes that when the water partial pressure in a chamber before the start of formation of an ITO film and during formation of the ITO film is extremely reduced to $1.0 \times 10^{-4}$ Pa or less, the time required for crystallization of the ITO film can be reduced. To achieve such a low partial pressure, moisture and gases adsorbed to a substrate film should be removed by reducing the chamber pressure before the start of formation of an ITO film. When the inside of the chamber is evacuated using a vacuum pump, the time required for evacuation exponentially increases as the ultimate pressure becomes lower (the ultimate vacuum degree becomes higher). For reducing the water partial pressure in a chamber to $1.0 \times 10^{-4}$ Pa or less before the start of formation of an ITO film, a long period of time is needed for evacuation before film formation, so that the time required to complete film formation after introduction of a film substrate into the chamber (occupancy time of film deposition apparatus) increases, and therefore productivity as a whole tends to be reduced, although the crystallization time is reduced.

PRIOR ART DOCUMENTS

Patent Documents

Patent Document 1: JP-A-2011-18623
Patent Document 2: JP-A-2010-80290
Patent Document 3: JP-A-2012-114070
Patent Document 4: JP-A-2012-134085

SUMMARY OF THE INVENTION

Problems to be Solved by the Invention

In view of the above-mentioned problems, an object of the present invention is to provide a substrate with a transparent electrode which is excellent in productivity and which includes a low-resistance ITO film. More specifically, an object of the present invention is to provide a substrate with a transparent electrode in which an amorphous transparent electrode layer capable of being crystallized in a short period of time by annealing at a relatively low temperature is provided on a transparent film substrate with the use of an ITO target having a high tin oxide content.

Means for Solving the Problems

The present inventors have conducted intensive studies, and have found as a result that when the amount of low-resistance grains in an amorphous transparent electrode layer before crystallization is increased, activation energy required for crystallization can be decreased, so that the time required for crystallization can be reduced.

That is, the present invention relates to a substrate with a transparent electrode in which an amorphous transparent electrode layer is provided on a transparent film substrate, and the amorphous transparent electrode layer contains an amorphous indium-tin composite oxide having a tin oxide content of 6.5% by mass or more and less than 16% by mass. When a bias voltage of 0.1 V is applied to the amorphous transparent electrode layer, the amorphous transparent electrode layer has continuous regions where a current value at a voltage-applied surface is 50 nA or more. Each of the continuous regions has an area of 100 $nm^2$ or more. The number of the continuous regions is 50/$\mu m^2$ or more.

In one embodiment of the substrate with a transparent electrode according to the present invention, the tin oxide content of the amorphous transparent electrode layer is more than 8% by mass and less than 16% by mass. When the content of tin oxide falls within the above-mentioned range, a crystalline transparent electrode layer having a lower resistance is obtained in crystallization of the amorphous transparent electrode layer by heating. In another embodiment of the substrate with a transparent electrode according to the present invention, the tin oxide content of the amorphous transparent electrode layer is 6.5% by mass to 8% by mass. When the content of tin oxide falls within the above-mentioned range, a low resistivity can be maintained, and the time required for crystallization can be further reduced.

A thickness of the amorphous transparent electrode layer is preferably 10 nm to 35 nm. The time required for crystallization of the amorphous transparent electrode layer is preferably 30 minutes or less when the amorphous transparent electrode layer is heated at 150° C. Activation energy for crystallization of the amorphous transparent electrode layer is preferably 1.3 eV or less. A resistivity after the amorphous transparent electrode layer is subjected to a heating treatment at 150° C. for 30 minutes is preferably $1.5 \times 10^{-4}$ to $3.0 \times 10^{-4}$ Ωcm.

Further, the present invention relates to a method for manufacturing a substrate with a transparent electrode in which an amorphous transparent electrode layer is provided on a transparent film substrate, and the transparent film substrate contains ITO having a tin oxide content of 6.5% by mass or more and less than 16% by mass. In the manufacturing method of the present invention, a transparent electrode layer containing an amorphous indium-tin composite oxide is formed on a transparent film substrate using a sputtering method (transparent electrode layer forming step). In the transparent electrode layer forming step, a composite oxide target of indium oxide and tin oxide, which has a tin oxide content of 6.5% by mass or more and less than 16% by mass, is used. The tin oxide content of the target is preferably more than 8% by mass and less than 16% by mass.

In one embodiment of the manufacturing method of the present invention, a power density of a power source during formation of a transparent electrode layer is 2.0 $W/cm^2$ or more. In another embodiment of the manufacturing method of the present invention, pre-sputtering is performed at a power density of a power source of 2.0 $W/cm^2$ or more before the start of formation of a transparent electrode layer. The power density of the power source in pre-sputtering is preferably equal to or more than the power density of the power source during formation of the transparent electrode layer. Pre-sputtering may be performed before the start of formation of a transparent electrode layer, followed by formation of the transparent electrode layer at a power density of 2.0 $W/cm^2$ or more.

In the manufacturing method of the present invention, evacuation is preferably performed until a water partial pressure in a chamber reaches $2 \times 10^{-4}$ Pa to $1 \times 10^{-3}$ Pa before formation of the transparent electrode layer. The water partial pressure in the chamber during formation of the transparent electrode layer is preferably $3 \times 10^{-4}$ Pa to $3 \times 10^{-3}$ Pa.

Further, the present invention relates to a method for manufacturing a substrate with a transparent electrode in which a low-resistance crystalline transparent electrode layer is provided on a transparent film substrate. By heating the amorphous transparent electrode layer, amorphous ITO is crystallized to obtain a crystalline transparent electrode layer. A resistivity of the crystalline transparent electrode layer is preferably $1.5 \times 10^{-4}$ to $3.0 \times 10^{-4}$ Ωcm.

Effects of the Invention

In a substrate with a transparent electrode according to the present invention, the tin oxide content of an amorphous transparent electrode layer is high, and therefore the resistance of the transparent electrode layer after crystallization is reduced. The density of low-resistance grains in the amorphous transparent electrode layer is high, and therefore the time required for completing crystallization of ITO is short. Further, it is not necessary to excessively reduce the pressure in a chamber before the start of formation of the transparent electrode layer, and therefore the time required for evacuation is reduced. That is, with respect to the substrate with a transparent electrode according to the present invention, the resistance can be reduced, and the substrate with a transparent electrode according to the present invention is excellent in productivity because both the time required until completion of film formation after introduction of a film substrate into a deposition chamber (occupancy time of film deposition apparatus) and the time required for crystallization after completion of film formation are short, so that the time required for the manufacturing process as a whole can be reduced.

MODE FOR CARRYING OUT THE INVENTION

Preferred embodiments of the present invention will be described below. In each drawing in the present application, dimensional relations of thickness and so on are appropriately changed for clarification and simplification of the drawings, and do not reflect actual dimensional relations.

Figure 1:
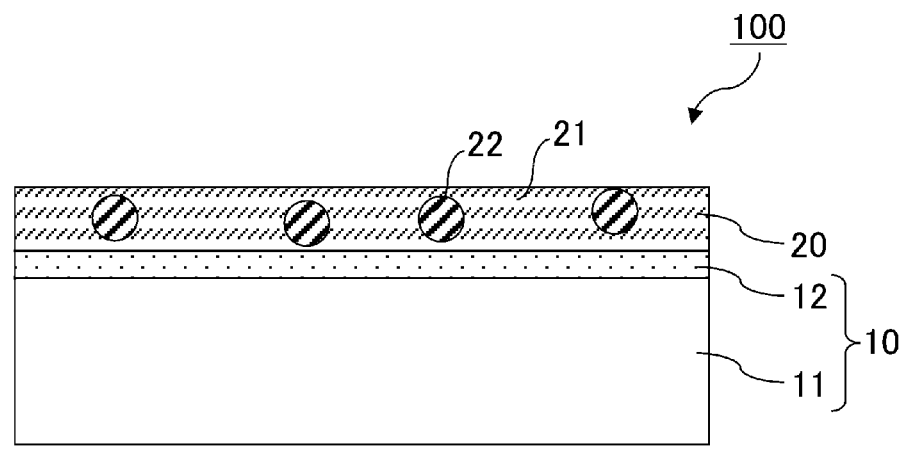
FIG. 1 is a schematic sectional view of a substrate with a transparent electrode according to one embodiment.

FIG. 1 is a schematic sectional view of a substrate 100 with a transparent electrode in which a transparent electrode layer 20 is provided on a transparent film substrate 10. The transparent electrode layer 20 is an amorphous film, and contains low-resistance grains 22 in an amorphous phase 21.

[Transparent Film Substrate]

As the transparent film substrate, one that is colorless and transparent in a visible light region is used. As the material of the transparent film substrate, for example, it is preferable to use general-purpose resins such as polyester resins such as polyethylene terephthalate (PET), polybutylene terephthalate (PBT), and polyethylene naphthalate (PEN); cycloolefin-based resins; polycarbonate resins; and cellulose-based resins. The glass transition temperature of a transparent film composed of such a general-purpose resin is generally about 50° C. to 150° C. A resin such as a transparent polyimide has a high glass transition temperature of 200° C. or higher, but a film composed of such an extremely heat-resistant resin is very expensive. Therefore, the material of the transparent film is preferably a general-purpose resin as described above in view of reducing manufacturing costs of the substrate with a transparent electrode. Among them, polyethylene terephthalate and the cycloolefin-based resin are suitably used.

The thickness of the transparent film substrate is not particularly limited, but is preferably 0.01 to 0.4 mm, more preferably 0.02 to 0.3 mm. The film substrate becomes less susceptible to deformation due to deposition as its thickness increases. On the other hand, when the thickness of the film substrate is excessively great, flexibility is lost, so that formation of the transparent electrode layer by a roll-to-roll method tends to be difficult. When the thickness of the transparent film substrate falls within the above-mentioned range, deformation of the film substrate by heat is suppressed, so that a transparent electrode layer can be formed with high productivity by a roll-to-roll method.

As shown in FIG. 1, the transparent film substrate 10 may include an underlying layer 12 on a transparent film 11. The underlying layer 12 serves as a ground for film formation in formation of the transparent electrode layer 20 on the transparent film substrate 10. For example, when an inorganic insulating layer such as that of silicon oxide (SiOx) is provided as the underlying layer 12, adhesion between the transparent film substrate 10 and the transparent electrode layer 20 can be improved. The transparent film substrate 10 may include an organic material layer or an organic-inorganic composite material layer as the underlying layer 12. The organic material layer or the organic-inorganic composite material layer can act as an easy-adhesion layer or a stress buffer layer. The underlying layer 12 may include only one layer, or may have a laminated structure of two or more layers.

The underlying layer 12 of the transparent film substrate may have a function as an index-matching layer. For example, by using the underlying layer 12 in which a medium-refractive-index layer composed of SiOx (x=1.8 to 2.0), a high-refractive-index layer composed of niobium oxide and a low-refractive-index layer composed of $SiO_2$ are laminated in this order from the transparent film 11 side, the pattern visibility when the transparent electrode layer is patterned can be suppressed. The structure of the index-matching layer is not limited to such a three-layer structure. The thickness of each layer can be appropriately set while a refractive index, etc., of the material is taken into consideration.

When an inorganic insulating layer such as that of silicon oxide or niobium oxide is formed as the underlying layer 12 on the transparent film, the method for forming the inorganic insulating layer is preferably a sputtering method because a homogeneous film having reduced impurities can be formed, and the film formation speed is high, leading to excellent productivity. As a sputtering target, a metal, a metal oxide, or a metal carbide can be used.

For the purpose of improving adhesion between the transparent film substrate 10 and the transparent electrode layer 20, a substrate surface may be subjected to a surface treatment. Examples of the surface treatment method include methods for improving adhesive strength by imparting electrical polarity to a substrate surface. Specific examples thereof include corona discharge and plasma treatment.

[Transparent Electrode Layer]

The transparent electrode layer 20 composed of ITO is formed on the transparent film substrate 10. Preferably, the transparent electrode layer 20 is formed by a sputtering method. The thickness of the transparent electrode layer is not particularly limited, and is appropriately set according to a desired resistance value, etc. When the substrate with a transparent electrode is used for a position detection electrode of a touch panel, the thickness of the transparent electrode layer 20 is preferably 10 nm to 35 nm, more preferably 15 nm to 30 nm.

The ITO transparent electrode layer formed on the transparent film substrate by a sputtering method is an amorphous film in an as-deposited state immediately after film formation. Preferably, the amorphous transparent electrode layer 20 contains low-resistance grains 22 in the amorphous phase 21. In this specification, a material having a crystallization rate of 30% or less is defined as being amorphous. The crystallization rate is determined from a ratio of an area constituted by crystal grains in an observation visual field during observation with a microscope.

The tin oxide content of the amorphous transparent electrode layer is 6.5% by mass or more and less than 16% by mass based on the total amount of indium oxide and tin oxide. When the tin oxide content falls within the above-mentioned range, the resistance of the transparent electrode layer after crystallization can be reduced. When the tin oxide content is excessively low, the transparent electrode layer after crystallization has a small carrier density, so that sufficient reduction of the resistance cannot be expected. On the other hand, when the tin oxide content is excessively high, tin oxide scatters electrons to reduce the mobility, so that the resistance tends to increase. Further, when the tin oxide content is excessively high, the carrier content in the film may extremely increase to cause absorption of light having a long wavelength, leading to a decrease in transmittance of visible light. Thus, to make it possible to perform crystallization in a shorter time, the tin oxide content of the amorphous transparent electrode layer is preferably 6.5% by mass to 8% by mass. On the other hand, to further reduce the resistance of the transparent electrode layer after crystallization, the tin oxide content of the amorphous transparent electrode layer is preferably more than 8% by mass and less than 16% by mass, more preferably more than 8% by mass and 14% by mass or less, further preferably 9% by mass to 12% by mass.

In the present invention, the amorphous transparent electrode layer 20 preferably has a large number of regions where the current value at a voltage-applied surface is large when a bias voltage is applied thereto. More specifically, when a bias voltage of 0.1 V is applied, the number of regions where the current value at a voltage-applied surface is 50 nA or more is preferably $50/\mu m^2$ or more.

A current at the voltage-applied surface is measured in the following manner using a scanning probe microscope provided with an electroconductive cantilever. A measurement region is scanned while a current passing into the cantilever is monitored with the electroconductive cantilever brought into contact with the voltage-applied surface. By this measurement, a two-dimensional distribution of current (current image) is obtained. In this measurement, a constant bias voltage is applied to the transparent electrode layer, and therefore a portion having a large current has a low resistance. In other words, the current image (distribution of current values) indicates a distribution of resistance.

Figure 6:
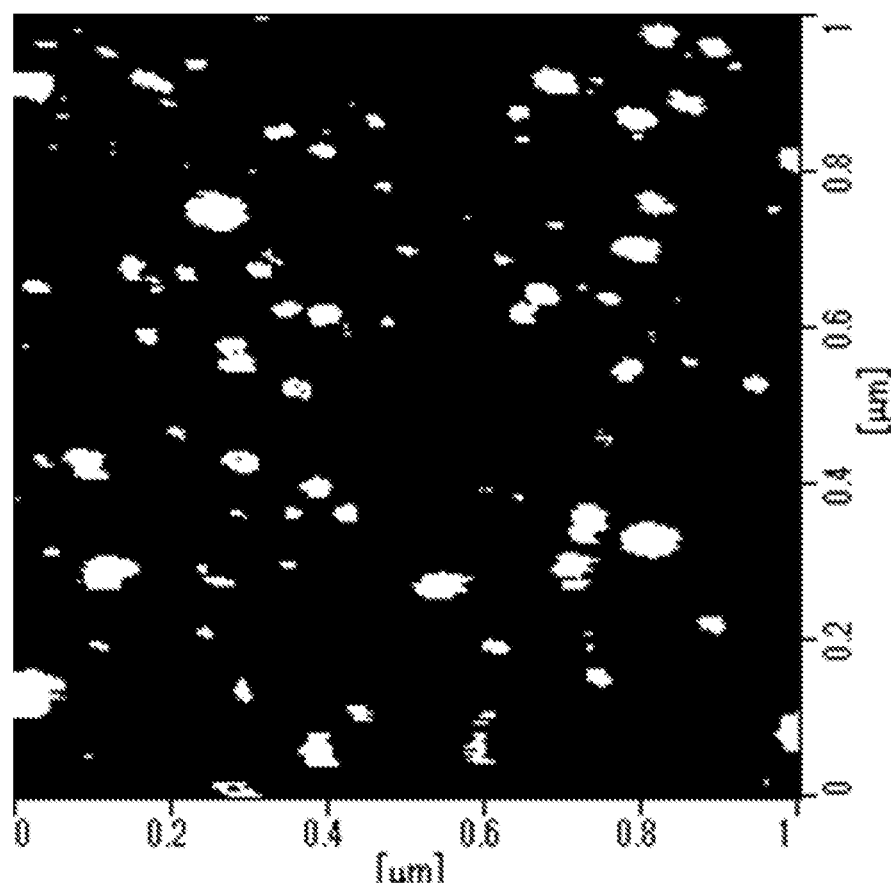
FIG. 6 is a view showing a current image (after binarization processing) of a surface of a transparent electrode layer in an Example.
Figure 7:
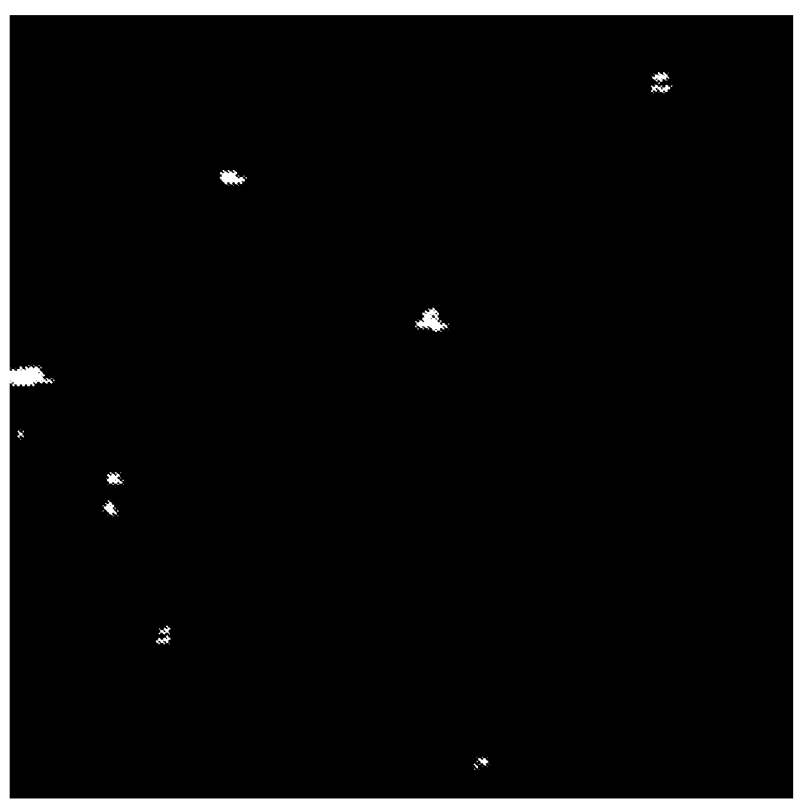
FIG. 7 is a view showing a current image (after binarization processing) of a surface of a transparent electrode layer in a Comparative Example.

The obtained current image is subjected to binarization processing with a threshold of 50 nA, a continuous region where the area of a region with a current level of 50 nA or more (low-resistance region) is $100\ nm^2$ or more is considered as one low-resistance grain, and the number of the low-resistance grains is counted to determine the number of regions where the current value at the voltage-applied surface is 50 nA or more (see FIGS. 6 and 7).

As described above, the amorphous transparent electrode layer 20 before being crystallized (annealed) by heating has low-resistance grains 22 buried in the high-resistance amorphous phase 21. By measuring a resistance distribution in a very small region, a distribution of low-resistance grains can be evaluated. As the density of regions where the current value at the voltage-applied surface is large (low-resistance grains) in the amorphous transparent electrode layer increases, the activation energy required for crystallization tends to decrease, leading to a reduction of the crystallization time. The density of regions where the current level is 50 nA or more is preferably $50/\mu m^2$ or more, more preferably $80/\mu m^2$ or more, further preferably $100/\mu m^2$ or more, most preferably $120/\mu m^2$ or more. The upper limit of the density of low-resistance grains is not particularly limited. When film formation is performed at a temperature that is not higher than the heat resistance temperature of the film substrate (150° C. or lower), the density of low-resistance grains in the amorphous transparent electrode layer is generally $1000/\mu m^2$ or less, preferably $500/\mu m^2$ or less, more preferably $400/\mu m^2$ or less.

Preferably, formation of the transparent electrode layer 20 on the transparent film substrate 10 is performed by a roll-to-roll method using a roll-to-roll sputtering apparatus for improving productivity of the substrate with a transparent electrode. The power source to be used for sputtering deposition is not particularly limited, and a DC, MF, or RF power source or the like is used. For improving productivity of the substrate with a transparent electrode, the power source to be used for sputtering deposition of the transparent electrode layer is preferably a DC power source or a MF power source, particularly preferably a DC power source.

Particularly, when pre-sputtering is performed before formation of the transparent electrode layer, the density of low-resistance grains in the transparent electrode layer can be increased by a short period of time for pre-sputtering if a DC power source is used.

Preferably, a composite sintered body obtained by solid-dissolving tin oxide with indium oxide is used as a sputtering target. The content of tin oxide in the target is preferably 6.5% by mass or more and less than 16% by mass based on the total amount of indium oxide and tin oxide. The content of tin oxide in the target is selected within the above-mentioned range so that the tin oxide content of the amorphous transparent electrode layer falls within the above-described range.

The conditions for sputtering deposition of the transparent electrode layer are not particularly limited as long as the density of low-resistance grains in an as-deposited state can be made to fall within the above-mentioned range. The density of low-resistance grains tends to be increased by performing pre-sputtering before the start of formation of the transparent electrode layer, increasing the power density of the power source during formation of the transparent electrode layer, raising the substrate temperature, or the like. More specifically, an amorphous transparent electrode layer having a low-resistance grain density of $50/\mu m^2$ or more is formed by performing pre-sputtering at a power density of a power source of 2.0 $W/cm^2$ or more, more preferably 3.0 $W/cm^2$ or more, before the start of film formation; setting the power density of the power source during film formation to 2.0 $W/cm^2$ or more, more preferably 3.0 $W/cm^2$ or more; setting the heating temperature (substrate temperature) during film formation to 100° C. to 150° C., more preferably 100° C. to 120° C.; or combining these conditions.

It is known that water molecules are adsorbed to a chamber opened to the atmosphere. Water molecules in the chamber are caught in the film during formation of a transparent conductive oxide layer such as that of ITO, and can act as a factor that hinders crystallization. Thus, when water molecules are caught in the film, the time for crystallization of the amorphous transparent electrode layer tends to increase. Accordingly, in the present invention, it is preferable that after the film substrate is put in a sputtering deposition apparatus and before the transparent electrode layer is formed, the chamber is evacuated to reduce the water partial pressure in the chamber. By performing evacuation while conveying the film substrate, not only water adsorbed to the chamber but also moisture existing inside and on the surface of the film substrate can be removed, so that the time for crystallization of the amorphous transparent electrode layer can be reduced.

By evacuation before the start of film formation, the water partial pressure in the chamber is reduced to preferably $1 \times 10^{-3}$ Pa or less, more preferably $8 \times 10^{-4}$ Pa or less, further preferably $6 \times 10^{-4}$ Pa or less. The crystallization time tends to be reduced as the water partial pressure before the start of film formation becomes lower. On the other hand, the time required for evacuation exponentially increases as the ultimate pressure decreases, and therefore when the water partial pressure before the start of film formation is set to be excessively low, the time required for a pre-step of film formation (until the start of film formation after introduction of the film substrate into the chamber) increases, so that productivity may be reduced. Therefore, the water partial pressure in the chamber as achieved by evacuation before the start of film formation is preferably $2 \times 10^{-4}$ Pa or more. The water partial pressure in the chamber before the start of film formation and during film formation can be measured by quadrupole mass spectrometry (Qmass).

When pre-sputtering is performed before the start of formation of the transparent electrode layer, it is preferable that evacuation is performed so as to ensure that the water partial pressure in the chamber falls within the above-mentioned range before pre-sputtering. When an inorganic insulating layer, such as that of silicon oxide, as the underlying layer 12 and the transparent electrode layer 20 are continuously formed using a sputtering deposition apparatus including a plurality of chambers, it is preferable that evacuation is performed so as to ensure that the water partial pressure in the chamber falls within the above-mentioned range before the start of formation of the inorganic insulating layer.

In the present invention, by performing pre-sputtering as described above, or adjusting the power density and the substrate temperature during film formation, the low-resistance grain density of the amorphous transparent electrode can be increased to reduce the crystallization time without the necessity to excessively decrease the water partial pressure before the start of film formation. "Pre-sputtering" herein means that a part, which does not form a product, of the transparent film substrate is subjected to sputtering discharge before the ITO transparent electrode layer is formed. For example, when the underlying layer 12 such as silicon oxide is formed on the transparent film 11, "pre-sputtering" means that discharge is performed after formation of the underlying layer and before formation of the ITO transparent electrode layer.

When pre-sputtering is performed before the start of formation of the transparent electrode layer, the pressure in the chamber is preferably equal to or lower than the pressure during formation of the transparent electrode layer in view of removing impurities on the target by evacuation. The optimum value of the introduction amount of oxygen during pre-sputtering varies depending on an oxidation state of the surface of the target, etc. Therefore, it is preferable that depending on properties of the target, etc., the oxygen partial pressure is set so that the crystallization time after formation of the transparent electrode layer is shortened.

The optimum value of the power density during pre-sputtering may somewhat vary depending on an apparatus size (chamber volume), etc., but is preferably 2.0 W/cm² or more, more preferably 3.0 W/cm² or more as described above. The power density of the power source during pre-sputtering is preferably equal to or more than the power density of the power source during formation of the transparent electrode layer. The power density during pre-sputtering is preferably 1 to 10 times, more preferably 1.5 to 5 times, further preferably 2 to 4 times as large as the power density during formation of the transparent electrode layer. When pre-sputtering is performed at a high power density, and the transparent electrode layer is formed at a power density equal to or lower than the power density for pre-sputtering, the density of low-resistance grains can be increased while damage to the film substrate, etc., due to deposition is suppressed. Thus, an amorphous transparent electrode layer which is crystallized in a short period of time and has a low resistivity after crystallization is obtained.

The temperature during pre-sputtering is not particularly limited, but generally ranges from room temperature (about 20° C.) to 150° C. Pre-sputtering may be performed at a temperature lower than room temperature (for example, while a film formation roll is cooled). The pre-sputtering time can be appropriately set according to conditions such as a state of the surface of the target, a temperature in pre-sputtering and a power density, but is preferably 3 minutes or more, more preferably 5 minutes or more.

After pre-sputtering is performed as necessary, the transparent electrode layer is formed while an inert gas, such as argon, and oxygen are introduced into the chamber. The deposition pressure after introduction of process gases is preferably 0.2 Pa to 0.6 Pa. The introduction amount of process gases such as argon and oxygen during formation of the transparent electrode layer is set in view of a balance with a chamber volume, a deposition pressure, a deposition power density, and so on. The introduction amount of an inert gas such as argon is preferably 200 sccm to 1000 sccm, more preferably 250 sccm to 500 sccm. The introduction amount of the oxygen gas is preferably 1 sccm to 10 sccm, more preferably 2 sccm to 5 sccm.

The water partial pressure in the chamber during formation of the transparent electrode layer is preferably $3\times10^{-3}$ Pa or less, more preferably $2\times10^{-3}$ Pa or less. The crystallization time tends to be reduced as the water partial pressure during film formation becomes lower. On the other hand, to decrease the water partial pressure during film formation, the water partial pressure before the start of film formation should be decreased, so that the time required for evacuation tends to increase. When attempting to keep the water partial pressure during film formation low, it may be difficult to increase the size of the apparatus, and the types of film substrates that can be used may be limited (use of a film having a large moisture content may be difficult). Thus, the water partial pressure during film formation is preferably $3\times10^{-4}$ Pa or more, more preferably $5\times10^{-4}$ Pa or more.

When pre-sputtering is performed before formation of the transparent electrode layer, the power density during film formation is not particularly limited as long as sputtering discharge can be generated, and the power density may be set to any value equal to or more than, for example, 0.4 W/cm². When pre-sputtering is not performed before formation of the transparent electrode layer, the power density in formation of the transparent electrode layer is preferably 2 W/cm² or more, more preferably 2.5 W/cm² or more.

On the other hand, the deposition power density is preferably 10 W/cm² or less in view of suppressing film formation damage. When the power density is excessively high, the crystallization speed increases, but the resistivity after crystallization may not be sufficiently low due to deposition damage, etc. When pre-sputtering is performed before film formation as described above, the power density during film formation may be less than 2 W/cm². For example, even when the power density during film formation is about 0.4 W/cm² to 0.8 W/cm², an amorphous transparent electrode layer which has a high density of low-resistance grains and is crystallized in a short period of time is obtained.

As the substrate temperature during formation of the transparent electrode layer rises, the density of low-resistance grains tends to increase, leading to a reduction of the crystallization time. Thus, the substrate temperature is preferably 20° C. or higher, more preferably 30° C. or higher. The substrate temperature is the temperature of the film substrate during film formation. When pre-sputtering is performed before formation of the transparent electrode layer, or the deposition power density is 2 W/cm² or more, the density of low-resistance grains can be ensured to be 50/μm² or more even in film formation at room temperature where heating is not performed during film formation. Even in film formation at room temperature, the substrate temperature may rise to about 50° C. because the film formation roll and the film substrate are heated by sputtering discharge. By increasing the power density during pre-sputtering, or increasing the pre-sputtering time, the density of low-resistance grains can be ensured to be $50/\mu m^2$ or more even when film formation is performed at a substrate temperature lower than 20° C.

When the substrate temperature during formation of the transparent electrode layer is 100° C. or higher, the density of low-resistance grains tends to further increase, leading to a further reduction of the crystallization time. On the other hand, in view of suppressing damages such as thermal deformation of the film substrate, the substrate temperature during formation of the transparent electrode layer is preferably 100° C. or lower, more preferably 90° C. or lower. In the present invention, by performing pre-sputtering, or increasing the deposition power density, a transparent electrode layer capable of being crystallized in a short period of time can be formed without the necessity to excessively raise the substrate temperature as described above.

As described above, the amorphous transparent electrode layer is formed on the transparent film substrate by sputtering to obtain a substrate with a transparent electrode. In the present invention, a transparent electrode layer capable of being crystallized in a short period of time is formed without the necessity to perform excessive evacuation and heating at a high temperature. Thus, the process window of film formation conditions is wide and variations in characteristics within the film formation surface are suppressed, so that a large-area substrate with a transparent electrode is obtained.

The resistivity of the amorphous transparent electrode layer is preferably in a range of about $5 \times 10^{-4}$ $\Omega \cdot cm$ to $9 \times 10^{-4}$ $\Omega \cdot cm$, more preferably $6 \times 10^{-4}$ $\Omega \cdot cm$ to $8 \times 10^{-4}$ $\Omega \cdot cm$. The carrier density of the amorphous transparent electrode layer is preferably about $3 \times 10^{-20}/cm^3$ to $5 \times 10^{-20}/cm^3$. The carrier density in the film tends to increase as the tin oxide content in the ITO film becomes higher.

[Crystallization of Transparent Electrode Layer]

Preferably, the substrate with a transparent electrode according to the present invention in which an amorphous transparent electrode layer is provided on a transparent film substrate has a reduced resistance due to crystallization of the transparent electrode layer. The amorphous transparent electrode layer in an as-deposited state is mostly composed of amorphous ITO. When the amorphous ITO is changed into a crystalline state, the transparent electrode layer has a reduced resistance. For example, by heating/annealing the substrate with a transparent electrode in the presence of oxygen, the amorphous transparent electrode layer is transformed into a crystalline transparent electrode layer. The "heating/annealing" described above means a treatment in which heat from a heat source is actively applied to the transparent electrode for a certain period of time for heating during crystallization of ITO, formation of the electrode, or the like. In view of the heat resistance of the film substrate, the heating/annealing temperature for crystallization is preferably 180° C. or lower, more preferably 160° C. or lower.

As described above, in the substrate with a transparent electrode according to the present invention, the density of low-resistance grains in the amorphous transparent electrode layer is high, and therefore the time required for crystallization is short. Specifically, when heating/annealing is performed at 150° C., the time required until completion of crystallization is preferably 30 minutes or less. In the present invention, the time required to complete crystallization of the amorphous transparent electrode layer can also be reduced to 20 minutes or less, 15 minutes or less, 10 minutes or less, or 5 minutes or less by adjusting film formation conditions, etc. Whether or not crystallization has been completed is evaluated from a change in the resistance value before and after immersion of the substrate with a transparent electrode in 7% hydrochloric acid at room temperature for 30 seconds. When the ratio of the resistance after immersion to the resistance before immersion is 1.3 or less, it is considered that crystallization has been completed. When an acid treatment is performed under the above-mentioned conditions, the amorphous ITO is completely dissolved and removed, and therefore if crystallization is not sufficient, undissolved crystalline parts remain in the form of islands to be electrically insulated, so that the resistance considerably increases.

The level of the crystallization speed can also be determined from the crystallization time as described above, but more strictly, it is evaluated from the activation energy required for crystallization. In the substrate with a transparent electrode according to the present invention, the activation energy for crystallization of the amorphous transparent electrode layer is preferably 1.3 eV or less, more preferably 1.1 eV or less, further preferably 1.0 eV or less. The activation energy tends to decrease as the density of low-resistance grains in the amorphous transparent electrode layer becomes higher. The crystallization time becomes shorter as the activation energy decreases.

To calculate the activation energy required for crystallization, the Arrhenius equation is used as a relational expression between a rate constant and a temperature: $k = A \times \exp(-E/RT)$. k is a rate constant, E is the activation energy, A is a constant, R is the gas constant, and T is an absolute temperature.

When both sides of the equation are logarithmically transformed and arranged, the equation can be converted into the form of $\ln(1/k) = -E \times 1/(RT) - \ln(A)$, and by plotting $\ln(1/k)$ on the ordinate and plotting $1/(RT)$ on the abscissa, the activation energy E can be determined from the slope of the straight line (Arrhenius plot). Here, ln denotes a natural logarithm. In the present application, the reaction rate constant k is determined at three temperatures: 130° C., 140° C., and 150° C., and Arrhenius plotting is performed to calculate the activation energy E.

The reaction rate constant k can be determined from the relationship of $x = \exp(-kt)$ in the reaction rate theory where x is a reaction rate and t is an elapsed time after the start of reaction. Here, in the process of crystallization of the transparent electrode layer, the resistance is reduced with crystallization, and when crystallization is completed, a time-dependent change in resistance is terminated. That is, the amount of change in resistance reflects an amount of change from an amorphous state to a crystalline state, and by examining a time-dependent change in resistance during heating/annealing, a time-dependent change in the crystallization process can be examined. Thus, the reaction rate constant k is determined by monitoring the amount of change in resistance instead of the reaction rate (crystallization rate) x. The crystallization rate before heating/annealing is assumed to be 0%, the crystallization rate after completion of crystallization is assumed to be 100%, the crystallization rate at the time when the resistance reaches an average value Rh of a resistance value R0 before annealing and a resistance value $R_c$ after annealing is assumed to be 50%, the time th until the resistance reaches the average value $R_h$ is determined, and $x=0.5$ and $t=t_h$ are substituted in $x=\exp(-kt)$ to calculate the reaction rate constant k.

As described above, in the present invention, an amorphous transparent electrode layer having a high density of low-resistance grains is formed on the transparent film substrate, and thus rapid crystallization is possible even when the tin oxide content in the film is higher than 8% by mass. Since the tin oxide content in the film is high, the carrier density in the film is high, so that the transparent electrode layer after crystallization has a reduced resistance. That is, according to the present invention, a low-resistance substrate with a transparent electrode can be obtained with high productivity. In the present invention, a transparent electrode layer capable of being crystallized in a short period of time is obtained even when the water partial pressure before film formation is $2\times10^{-4}$ Pa or more. Thus, total productivity in the process ranging from film formation to heating and crystallization of the ITO is improved.

Further, in the substrate with a transparent electrode, which is obtained according to the present invention, the resistivity of the transparent electrode layer after crystallization is preferably $3.0\times10^{-4}$ Ωcm or less, more preferably $2.7\times10^{-4}$ Ωcm or less, further preferably $2.5\times10^{-4}$ Ωcm or less.

The substrate with a transparent electrode according to the present invention can be used as a transparent electrode for a display, a light-emitting device, a photoelectric conversion device, and the like, and is suitably used as a transparent electrode for a touch panel. Particularly, the substrate with a transparent electrode according to the present invention is suitably used for a capacitive touch panel because the transparent electrode layer after crystallization has a low resistance.

EXAMPLES

The present invention will be described more specifically below by providing Examples, but the present invention is not limited to these Examples.

[Measurement of Resistivity]

The sheet resistance of the transparent electrode layer was measured by four-point probe pressure contact measurement using a low resistivity meter Loresta GP (MCP-T710 manufactured by Mitsubishi Chemical Corporation). The resistivity of the transparent electrode layer was calculated from a product of the value of the sheet resistance and the thickness of the transparent electrode layer. The resistivity after crystallization was measured after a sample which had completed crystallization was taken out from an oven, and cooled to room temperature.

[Measurement of Crystallization Time]

Figure 2:
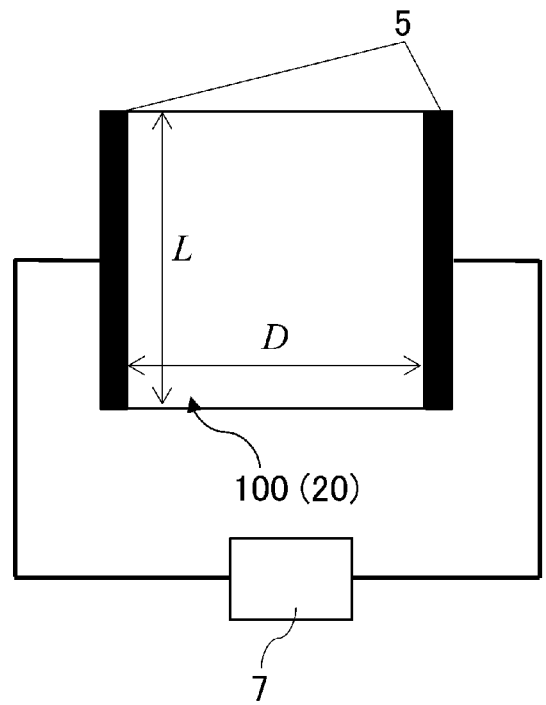
FIG. 2 is a schematic view of a substrate with a transparent electrode which is provided with parallel electrodes for measuring a change in resistivity during annealing.
Figure 3:
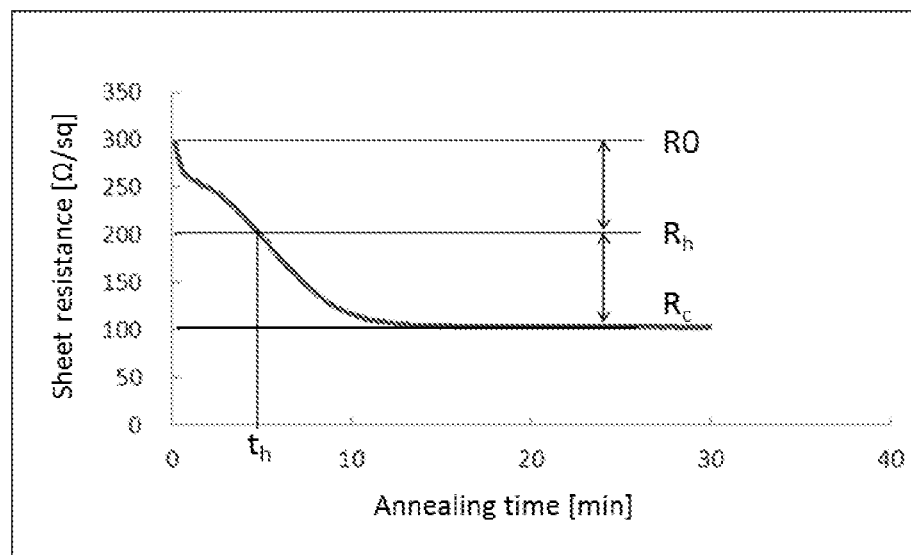
FIG. 3 is a view for explaining a method for determining a reaction rate constant from a graph showing a time-dependent change in resistance of an ITO film during annealing.
Figure 4:
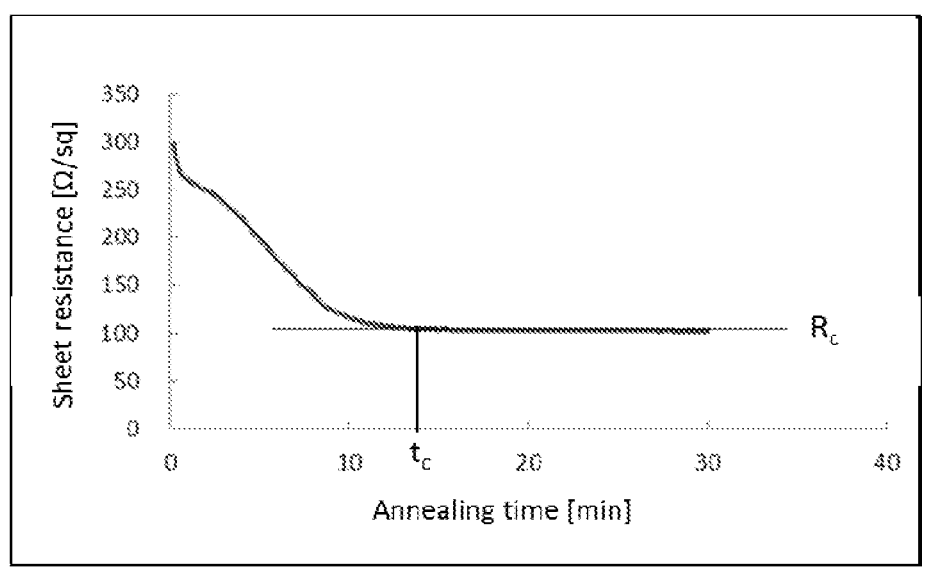
FIG. 4 is a graph showing a time-dependent change in resistance of an ITO film during annealing.

As shown in FIG. 2, parallel electrodes were mounted on two opposite edges of a surface of a substrate 100 with a transparent electrode before annealing, on a transparent electrode layer 20 side, and a resistance during annealing was measured. At the time of mounting the parallel electrodes, a distance D between electrodes and a length L of the edges on which the electrodes were mounted were made equal to each other, so that a sheet resistance could be calculated from a resistance value. The time until a difference between the resistance value and a resistance value $R_c$ at the time when a time-dependent change in resistance was lost was 2 Ω/sq or less was defined as crystallization completion time $t_c$. For example, in FIG. 4 (Example 1, heating temperature: 150° C.), it is apparent that the resistance value $R_c$ at the time when the time-dependent change in resistance is lost is 100 Ω/sq, and the crystallization completion time $t_c$ is 15 minutes.

[Measurement of Activation Energy]

The activation energy E at the time of crystallizing the amorphous transparent electrode layer was calculated from a dependency of a reaction rate constant k on temperature at the time of heating/annealing the substrate with an amorphous transparent electrode layer at a predetermined temperature to be crystallized. For each heating temperature, the heating time was plotted on the abscissa axis and the surface resistance of the transparent electrode layer was plotted on the ordinate axis, and a time t was determined at which the surface resistance value reached an average of the initial value (at the start of measurement) and the final value (state in which crystallization was completed to achieve a crystallinity degree of almost 100%). A reaction rate constant k was calculated at each heating temperature by substituting a reaction ratio of 0.5 into the equation: reaction ratio=1−exp (kt) with the reaction ratio considered to be 50% at the time t.

Figure 5:
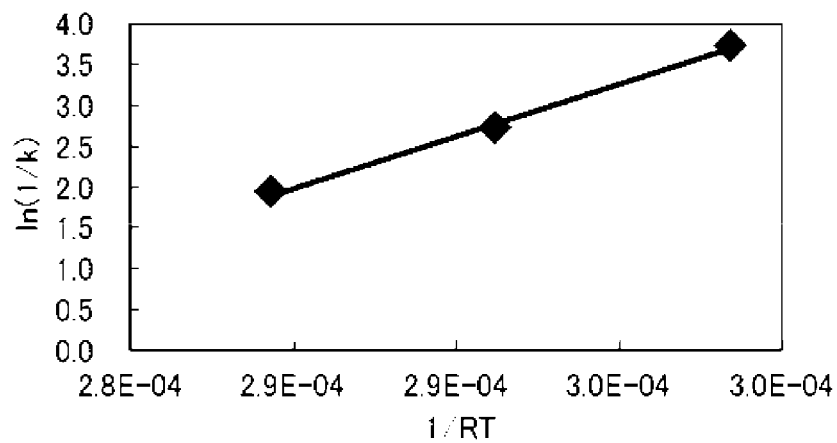
FIG. 5 is a graph (Arrhenius plot) in determination of activation energy for crystallization of an amorphous transparent electrode layer.

From the reaction rate constant k and heating temperature at each of heating temperatures of 130° C., 140° C. and 150° C., Arrhenius plotting (abscissa axis: 1/RT and ordinate axis: ln(1/k)) was performed, and the slope of the line was defined as an activation energy E. An Arrhenius plot in Example 1 is shown in FIG. 5. From the slope of the graph in FIG. 5, the activation energy for crystallization: E=1.25 eV was determined.

[Measurement of Low-Resistance Grains]

For measurement of the number of low-resistance regions, current image measurement was performed using an electroconductive cantilever (SI-DF3R, manufactured by SII NanoTechnology Inc., spring constant: 1.6 N/m) with a contact surface coated with rhodium at a thickness of 30 nm in a scanning probe microscope system (NanoNaviReal, manufactured by SII NanoTechnology Inc., scanner model: FS 20N) provided with a scanning probe microscope unit (Nanocute) and a measurement control unit (NanoNavi Probe station), and low-resistance regions were evaluated from a current image distribution.

A substrate with a transparent electrode was cut to a 5 mm square, and an ITO film surface and a sample holder were brought into conduction with each other with a copper tape interposed therebetween. A probe was brought into contact with a sample, a bias voltage of 1 V was then applied from the holder, and the sample was scanned over a range of 2 $\mu m^2$ to eliminate static electricity. The applied voltage was then changed to 0.1 V while keeping the probe in contact with the sample, the sample was scanned over a range of 1 $\mu m^2$ in the vicinity of the center of the region where static electricity was eliminated, and a shape image and a current image were obtained by two-screen measurement. The measurement was performed in an environment at room temperature. Detailed measurement conditions are as follows.

Measurement mode: AFM
Deflection amount: −1 mm
Scanning frequency: 1.08 Hz
I gain: 0.45
P gain: 0.11
A gain: 0
DIF sensitivity: 40.00 mV/nm
Dissolution (X×Y): 256×256
Image quality: standard The current image was subjected to binarization processing with a current value of 50 nA as a threshold using an analysis program (NanoNaviStation ver 6.00B) attached to the device. Here, tilt correction was not performed. FIG. 6 shows the current image of Example 1 subjected to binarization processing. In the current image subjected to binarization processing, a continuous region where the area of a part with a current value of 50 nA or more (white part in FIG. 6) was 100 $nm^2$ or more was considered as one low-resistance grain, and the number of the low-resistance grains was counted. From FIG. 6, the number of low-resistance grains can be found to be 51/$\mu m^2$.

[Measurement of Crystallization Rate]

The total amount of crystal components contained in the transparent electrode layer before performing annealing was evaluated by fully etching away amorphous components, and calculating the area of remaining crystal grains. As an etching condition, the sample was immersed in 1.7% hydrochloric acid at room temperature for 90 seconds, and then washed with flowing water. The surface of the sample was photographed by a scanning electron microscope, and the amount of remaining crystal components was determined from the image.

Example 1

Using a roll-to-roll-type sputtering apparatus, a silicon oxide layer and a transparent electrode layer were formed on a PET film substrate with a hard coat layer formed on each of both surfaces thereof, the PET film substrate having a glass transition temperature of 80° C.

First, the film substrate was introduced into a film deposition apparatus, evacuation was performed until the water partial pressure in a chamber reached $4 \times 10^{-4}$ Pa while the film was conveyed in the film deposition apparatus. Evacuation required 2 hours.

After the chamber was evacuated, a silicon oxide layer was formed by performing sputtering at a power density of 3.0 W/cm$^2$ using a MF power source under the conditions of a substrate temperature of 40° C. and a chamber pressure of 0.2 Pa while supplying oxygen at a flow rate of 20 sccm and argon at a flow rate of 100 sccm with the use of Si as a target. The obtained silicon oxide layer had a thickness of 45 nm.

Pre-sputtering was performed at a power density of 3.0 W/cm$^2$ for 15 minutes using a DC power source under the conditions of a substrate temperature of 40° C., a chamber pressure of 0.3 Pa and a water partial pressure of $1 \times 10^{-3}$ Pa while oxygen at a flow rate of 4.0 sccm and argon at a flow rate of 250 sccm were supplied into the chamber with the use of a composite oxide sintered target (tin oxide content: 10% by mass) of indium oxide and tin oxide. After pre-sputtering, the oxygen flow rate was changed to 2.0 sccm, and sputtering deposition was performed at a power density of 0.6 W/cm$^2$ using the DC power source, thereby forming an ITO transparent electrode layer on the silicon oxide layer. The obtained transparent electrode layer had a thickness of 26 nm.

The oxygen flow rate during formation of the transparent electrode layer was set so as to minimize time required for crystallization when conditions other than the oxygen flow rate were the same (the same applies for Examples and Comparative Examples below). The substrate temperature during film formation was determined by attaching a thermo label (TEMP-PLATE manufactured by I.P. LABORATORIES, INC) to the transparent film substrate beforehand, and reading a maximum temperature of the thermo label after completion of film formation. A region that would not be heated in evacuation was selected, and the thermo label was attached to the region. The thickness of the transparent electrode layer was determined by observation of a cross section with a transmission electron microscope (TEM). The water partial pressure before the start of film formation and during film formation was measured using quadrupole mass spectrometer.

Example 2

Pre-sputtering was not performed before formation of a transparent electrode layer, and the oxygen flow rate was 4.0 sccm and the power density was 3.0 W/cm$^2$ during formation of the transparent electrode layer. A substrate with a transparent electrode was prepared in the same manner as in Example 1 except that the above-mentioned changes were made. The obtained transparent electrode layer had a thickness of 26 nm.

Example 3

Pre-sputtering was performed for 15 minutes before formation of a transparent electrode layer, and an ITO transparent electrode layer was then formed under the same conditions as in the pre-sputtering. A substrate with a transparent electrode was prepared in the same manner as in Example 1 except that the above-mentioned changes were made. The obtained transparent electrode layer had a thickness of 26 nm.

Example 4

The degassing temperature before film formation and the substrate temperature during film formation were 120° C. A substrate with a transparent electrode was prepared in the same manner as in Example 3 except that the above-mentioned changes were made. The obtained transparent electrode layer had a thickness of 26 nm.

Example 5

The degassing temperature before film formation and the substrate temperature during film formation were 120° C. A substrate with a transparent electrode was prepared in the same manner as in Example 1 except that the above-mentioned changes were made. The obtained transparent electrode layer had a thickness of 26 nm.

Comparative Example 1

A substrate with a transparent electrode was prepared in the same manner as in Example 1 except that pre-sputtering was not performed before formation of the transparent electrode layer. The obtained transparent electrode layer had a thickness of 26 nm.

Comparative Example 2

A substrate with a transparent electrode was prepared in the same manner as in Example 5 except that pre-sputtering was not performed before formation of the transparent electrode layer. The obtained transparent electrode layer had a thickness of 26 nm.

Comparative Example 3

Before film formation, evacuation was performed until the water partial pressure in a chamber reached $1 \times 10^{-4}$ Pa. The water partial pressure during formation of a transparent electrode layer decreased to $2 \times 10^{-4}$ Pa. A substrate with a transparent electrode was prepared in the same manner as in Comparative Example 2 except that the above-mentioned changes were made. The obtained transparent electrode layer had a thickness of 26 nm. However, in Comparative Example 3, the time required for reducing the water partial pressure in the chamber to $1 \times 10^{-4}$ Pa before film formation was 30 hours. In Comparative Example 3, heating/annealing was performed at 150° C. after formation of the amorphous transparent electrode layer, but crystallization was not completed 30 minutes after the start of heating, and the resistivity was $4.4 \times 10^{-4}$ Ω·cm.

Conditions for formation of the transparent electrode layer, characteristics of the amorphous film after film formation, crystallization conditions (crystallization time and activation energy), and characteristics after crystallization in the Examples and Comparative Examples described above are shown in Table 1.

by combination of film formation conditions such as pre-sputtering before formation of the transparent electrode layer, increasing of the power density during film formation, raising of the substrate temperature, and so on, the number of low-resistance grains can be increased to further reduce the crystallization time.

Comparison of Comparative Example 2 and Comparative Example 3 shows that when the evacuation time before the start of film formation is increased, the water partial pressure

TABLE 1

| | | | Example 1 | Example 2 | Example 3 | Example 4 | Example 5 | Comparative Example 1 | Comparative Example 2 | Comparative Example 3 |
|---|---|---|---|---|---|---|---|---|---|---|
| Steps before film formation | Degassing | Temperature (° C.) | 90 | 90 | 90 | 120 | 120 | 90 | 120 | 120 |
| | | Water partial pressure ($\times 10^{-4}$ Pa) | 4 | 4 | 4 | 4 | 4 | 4 | 4 | 1 |
| | Pre-sputtering | Power density (W/cm$^2$) | 3 | — | 3 | 3 | 3 | — | — | — |
| | | Time (minutes) | 15 | | 15 | 15 | 15 | | | |
| Film formation conditions | | Power density (W/cm$^2$) | 0.6 | 3 | 3 | 3 | 0.6 | 0.6 | 0.6 | 0.6 |
| | | Temperature (° C.) | 40 | 40 | 40 | 120 | 120 | 40 | 120 | 120 |
| | | Pressure (Pa) | 0.3 | 0.3 | 0.3 | 0.3 | 0.3 | 0.3 | 0.3 | 0.3 |
| | Film formation gas flow rate | Ar (sccm) | 250 | 250 | 250 | 250 | 250 | 250 | 250 | 250 |
| | | O$_2$ (sccm) | 2 | 4 | 4 | 4 | 2 | 2 | 2 | 2 |
| | | Water partial pressure ($\times 10^{-4}$ Pa) | 10 | 10 | 10 | 10 | 10 | 10 | 10 | 2 |
| Characteristics of amorphous film | | Density of low-resistance grains (/μm$^2$) | 51 | 62 | 101 | 188 | 138 | 8 | 27 | 25 |
| | | Crystallization rate | 2.9% | 4.6% | 5.2% | 18.0% | 5.8% | 1.3% | 5.1% | N.D. |
| | | Resistivity ($\times 10^{-4}$) Ω·cm | 7.4 | 7.2 | 7.2 | 6.1 | 6.5 | 7.4 | 6.4 | 6.8 |
| Crystallization | | Crystallization completion time (minutes) | 15 | 15 | 5 | 3 | 15 | 2400 | 120 | 60 |
| | | Activation energy (eV) | 1.25 | 1.14 | 0.79 | 0.48 | 1.2 | 1.57 | 1.46 | 1.37 |
| Characteristics after crystallization | | Resistivity ($\times 10^{-4}$ Ω·cm) | 2.2 | 2.4 | 2.5 | 2.6 | 2.3 | 3.2 | 2.3 | 2.3 |

The results in Table 1 show that annealing time required for crystallization depends on a density of low-resistance grains, and thus the time for crystallization can be reduced as the number of low-resistance grains in the amorphous film increases. Specifically, when the density of low-resistance grains is 50/μm$^2$ or more, crystallization is completed in 30 minutes or less. The activation energy required for crystallization here is 1.3 eV or less. That is, when the amorphous transparent electrode layer in an as-deposited state after film formation contains a large number of low-resistance grains, the activation energy E for crystallization is low, and rapid crystallization is possible.

Comparison of Example 1 and Comparative Example 1 shows that when pre-sputtering is performed before deposition of ITO, the number of low-resistance grains increase, leading to an increase in crystallization speed. Comparison of Example 2 and Comparative Example 1 shows that when the transparent electrode layer is formed at a high power density, an effect comparable to that of pre-sputtering can be obtained. Comparison of Examples 1 and 2 and Example 3 shows that when pre-sputtering is performed, and the transparent electrode layer is then formed at a high power density, the crystallization speed further increases.

Comparison of Example 1 and Example 5 and comparison of Example 3 and Example 4 show that when the transparent electrode layer is formed at a high substrate temperature, the crystallization speed further increases. On the other hand, comparison of Examples 1 and 2 and Comparative Example 2 and comparison of Comparative Example 1 and Comparative Example 2 show that the crystallization speed can be more effectively increased by performing pre-sputtering or performing film formation at a high power density rather than performing film formation at a high substrate temperature (film formation temperature). Examples 1 to 5 show that before the start of film formation and during film formation decreases, leading to an increase in crystallization speed. However, in Comparative Example 3, considerable time is required for evacuation before the start of film formation for reducing the water partial pressure in the chamber. Thus, rather than the effect of improving productivity by reduction of the crystallization time, reduction of productivity due to an increase in the evacuation time (occupancy time of film deposition apparatus) before the start of film formation becomes noticeable, resulting in deterioration of productivity.

The density of low-resistance grains in Comparative Example 2 is substantially comparable to that in Comparative Example 3, and in Comparative Example 3, the time required for crystallization is longer as compared to Examples 1 to 5. These results show that reduction of the time for crystallization of the transparent electrode layer according to the present invention is based on a mechanism different from that of reduction of the crystallization time by reduction of the water partial pressure as has been known previously, and the present invention is superior to conventional techniques in both improvement of productivity and resistance reduction.

Example 6

Using a roll-to-roll-type sputtering apparatus, a silicon oxide layer and a transparent electrode layer were formed on a PET film substrate with a hard coat layer formed on each of both surfaces thereof, the PET film substrate having a glass transition temperature of 80° C.

First, the film substrate was introduced into a film deposition apparatus, evacuation was performed until the water partial pressure in a chamber reached $2 \times 10^{-4}$ Pa while the film was conveyed in the film deposition apparatus. After the chamber was evacuated, a silicon oxide layer having a thickness of 3 nm was formed under the same conditions as in Example 1.

Pre-sputtering was performed at a power density of 5.0 W/cm$^2$ for 180 minutes using a MF power source under the conditions of a film formation roll temperature (set temperature) of −20° C., a chamber pressure of 0.2 Pa and a water partial pressure of 1×10$^{-3}$ Pa while oxygen at a flow rate of 1.2 sccm and argon at a flow rate of 400 sccm were supplied into the chamber with the use of a composite oxide sintered target (tin oxide content: 7.5% by mass) of indium oxide and tin oxide. After pre-sputtering, an ITO transparent electrode layer was formed on the silicon oxide layer by performing sputtering deposition under the same conditions as those for the pre-sputtering. The thickness of the obtained transparent electrode layer was 26 nm, the resistivity was 6.0×10$^{-4}$ Ω·cm, and the number of low-resistance grains per 1 μm$^2$ was 56.

The transparent electrode layer was heated at 150° C. to be crystallized. The time required to complete crystallization was 20 minutes, and the resistivity of the transparent electrode layer after crystallization was 2.2×10$^{-4}$ Ω·cm. The activation energy for crystallization was 1.27 eV.

The results from Example 6 show that even when the tin oxide content is 8% by mass or less, an amorphous transparent electrode layer with the number of low-resistance grains being 50/μm$^2$ or more can be formed, and the transparent electrode layer can be crystallized in a short period of time of 30 minutes or less.

The invention claimed is:

1. A substrate with a transparent electrode, comprising:
   a transparent film substrate; and
   a transparent electrode layer on the transparent film substrate, wherein
   the transparent electrode layer has a crystallization ratio of 30% or less,
   the transparent electrode layer comprises an amorphous indium-tin composite oxide having a tin oxide content of 6.5% by mass to 8% by mass, and
   the transparent electrode layer includes low-resistance grains with a density of 50/μm$^2$ or more, wherein each of the low-resistance grains is a continuous region having an area of 100 nm$^2$ or more where a current value at a voltage-applied surface is 50 nA or more when a bias voltage of 0.1V is applied to the transparent electrode layer.

2. The substrate with the transparent electrode according to claim 1, wherein time required for crystallization of the transparent electrode layer is 30 minutes or less when the transparent electrode layer is heated at 150° C.

3. The substrate with the transparent electrode according to claim 1, wherein activation energy for crystallization of the transparent electrode layer is 1.3 eV or less.

4. The substrate with the transparent electrode according to claim 1, wherein a resistivity after the transparent electrode layer is subjected to a heating treatment at 150° C. for 30 minutes is 1.5×10$^{-4}$ to 3.0×10$^{-4}$ Ωcm.

5. The substrate with the transparent electrode according to claim 1, wherein the transparent electrode layer has a thickness of 10 nm to 35 nm.

* * * * *